US012567873B2

(12) United States Patent
Schaefer et al.

(10) Patent No.: US 12,567,873 B2
(45) Date of Patent: Mar. 3, 2026

(54) SELECTIVE MODE ERROR CONTROL

(71) Applicant: Micron Technology, Inc., Boise, ID (US)

(72) Inventors: Scott E. Schaefer, Boise, ID (US); Aaron P. Boehm, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 26 days.

(21) Appl. No.: 18/639,692

(22) Filed: Apr. 18, 2024

(65) Prior Publication Data

US 2024/0372566 A1 Nov. 7, 2024

Related U.S. Application Data

(60) Provisional application No. 63/464,085, filed on May 4, 2023.

(51) Int. Cl.
*H03M 13/00* (2006.01)
*H03M 13/15* (2006.01)

(52) U.S. Cl.
CPC .............................. *H03M 13/1575* (2013.01)

(58) Field of Classification Search
CPC .......... H03M 13/1575; H03M 13/159; H03M 13/611; H03M 13/095; H03M 13/19
See application file for complete search history.

(56) References Cited

U.S. PATENT DOCUMENTS

| | | | | |
|---|---|---|---|---|
| 7,020,824 B2 * | 3/2006 | Tanaka | ................... | H03M 13/00 714/755 |
| 7,334,179 B2 * | 2/2008 | Zhang | ................. | G06F 11/1008 714/763 |
| 8,607,121 B2 * | 12/2013 | Moyer | ................ | G06F 11/1016 714/763 |
| 8,914,712 B2 * | 12/2014 | Ramaraju | ............. | H03M 13/00 714/767 |
| 10,700,810 B2 * | 6/2020 | Pandey | ................. | H04L 1/0041 |
| 10,790,858 B2 * | 9/2020 | Choi | ..................... | H04L 1/0041 |
| 11,050,442 B2 * | 6/2021 | Zhang | ................. | G06F 11/1068 |
| 11,095,310 B2 * | 8/2021 | Kim | ..................... | H03M 13/152 |
| 11,646,094 B2 * | 5/2023 | Ware | ..................... | G11C 29/42 365/185.09 |
| 11,756,643 B2 * | 9/2023 | Jang | ....................... | G11C 29/44 365/185.09 |

* cited by examiner

*Primary Examiner* — Esaw T Abraham
(74) *Attorney, Agent, or Firm* — Holland & Hart LLP

(57) ABSTRACT

Methods, systems, and devices for selective modes for error control are described. A memory system may implement an error control engine supporting error correction operations and error detection operations. The error control engine may switch between an error correction mode and an error detection mode. The error control engine may receive data and error control information, generate additional error control information, and compare the received and generated error control information to detect one or more errors in the data. In some examples, the error control engine may be configured to operate in the error correction mode, and the error control engine may correct single-bit errors in the data. In other examples, the error control engine may be configured to operate in the error detection mode, and the error control engine may detect errors in the data and transmit an indication of the errors.

18 Claims, 6 Drawing Sheets

|  | Error Correction Mode | | | Error Detection Mode | | |
| --- | --- | --- | --- | --- | --- | --- |
|  | Single-Bit Error Correction | Double-Bit Error Detection | Multi-Bit Error Detection | Single-Bit Error Detection | Double-Bit Error Detection | Multi-Bit Error Detection |
| 64 + 8 SECDED | 100% | 100% | 71.5% | 100% | 100% | 99.6% |
| 128 + 8 SEC | 100% | 23.4%[a] | 46.5% | 100% | 100% | 99.6% |
| 128 + 9 SECDED | 100% | 100% | 73% | 100% | 100% | 99.8% |
| 256 + 16 SEC | 100% | 99–100%[b] | 99.6% | 100% | 100% | 99.998% |
| 256 + 16 SECDED | 100% | 100% | 99.6% | 100% | 100% | 99.998% |

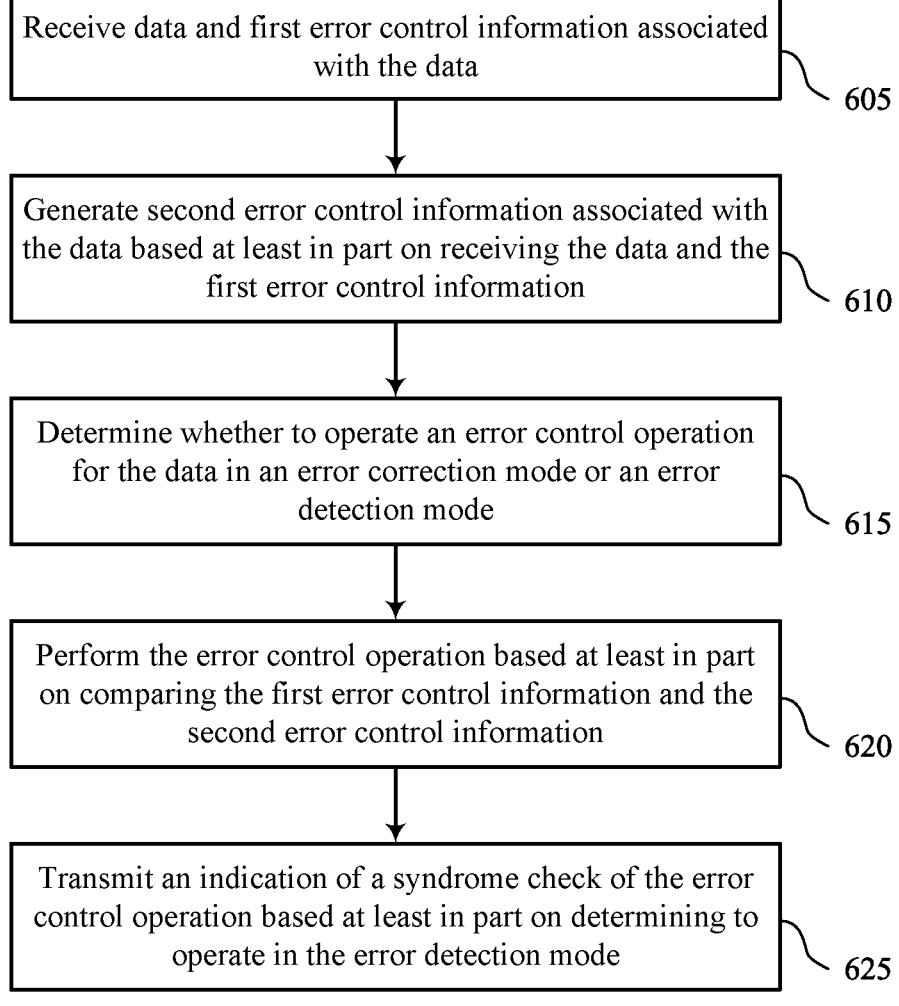

Receive data and first error control information associated with the data

605

Generate second error control information associated with the data based at least in part on receiving the data and the first error control information

610

Determine whether to operate an error control operation for the data in an error correction mode or an error detection mode

615

Perform the error control operation based at least in part on comparing the first error control information and the second error control information

620

Transmit an indication of a syndrome check of the error control operation based at least in part on determining to operate in the error detection mode

SELECTIVE MODE ERROR CONTROL

CROSS REFERENCE

The present Application for Patent claims priority to U.S. Patent Application No. 63/464,085 by Schaefer et al., entitled "SELECTIVE MODE ERROR CONTROL," filed May 4, 2023, which is assigned to the assignee hereof, and which is expressly incorporated by reference in its entirety herein.

TECHNICAL FIELD

The following relates to one or more systems for memory, including selective mode error control.

BACKGROUND

Memory devices are widely used to store information in devices such as computers, user devices, wireless communication devices, cameras, digital displays, and others. Information is stored by programming memory cells within a memory device to various states. For example, binary memory cells may be programmed to one of two supported states, often denoted by a logic 1 or a logic 0. In some examples, a single memory cell may support more than two states, any one of which may be stored. To access the stored information, the memory device may read (e.g., sense, detect, retrieve, determine) states from the memory cells. To store information, the memory device may write (e.g., program, set, assign) states to the memory cells.

Various types of memory devices exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), self-selecting memory, chalcogenide memory technologies, not-or (NOR) and not-and (NAND) memory devices, and others. Memory cells may be described in terms of volatile configurations or non-volatile configurations. Memory cells in a non-volatile configuration may maintain stored logic states for extended periods of time even in the absence of an external power source. Memory cells in a volatile configuration may lose stored states when disconnected from an external power source.

BRIEF DESCRIPTION OF THE DRAWINGS

FIG. 6 shows a flowchart illustrating a method or methods that support selective mode error control in accordance with examples as disclosed herein.

DETAILED DESCRIPTION

Figure 1:
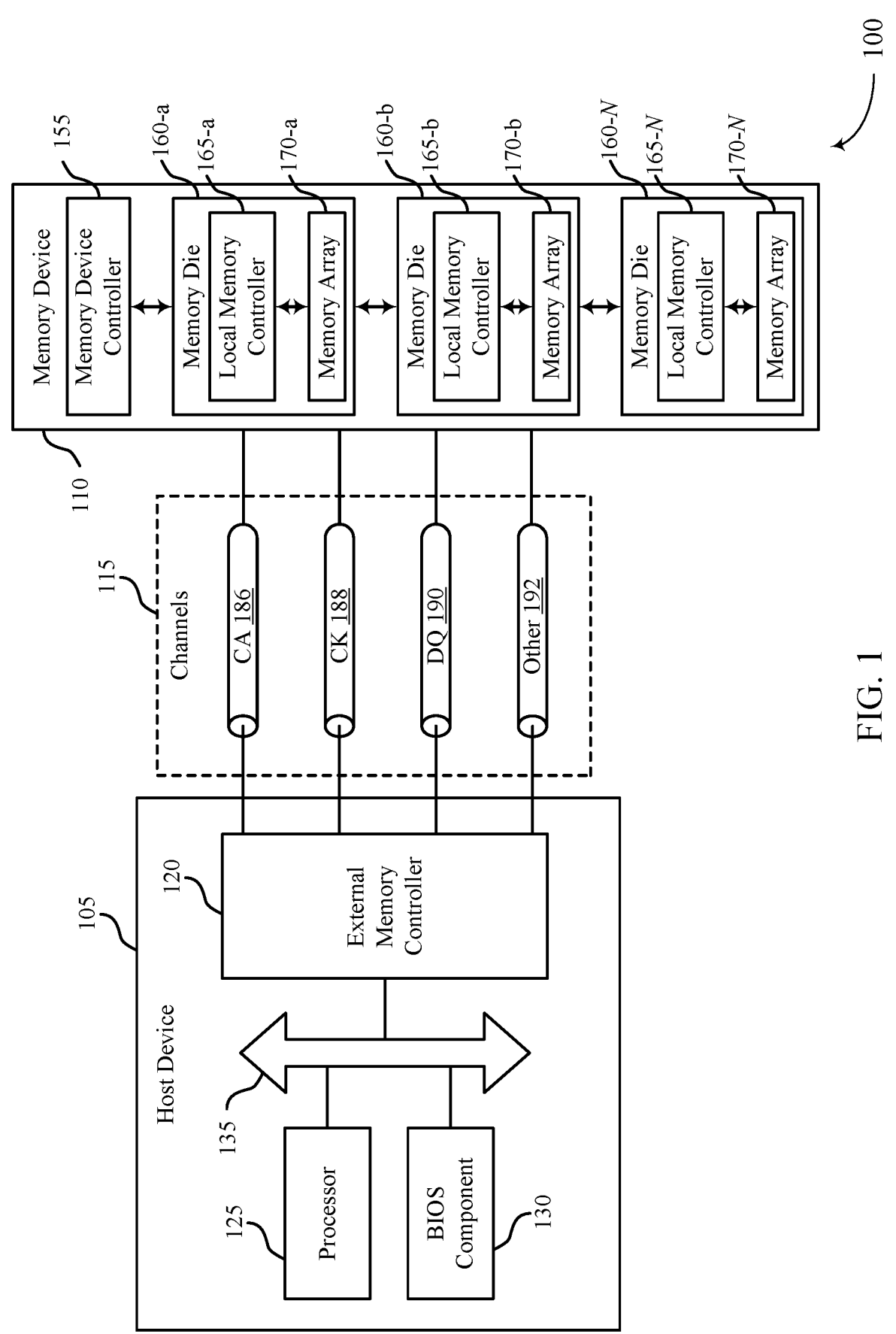
FIG. 1 shows an example of a system that supports selective mode error control in accordance with examples as disclosed herein.

Some memory systems (e.g., memory devices, host devices) may implement error control engines to support error control operations for data of the memory systems. For example, an error control engine may be configured to perform an error control operation to detect or correct errors in the data. In some cases, an error control engine of a memory system may be configured to support error correction operations (e.g., error correction code (ECC) operations), which may be associated with performing single-bit error correction of the data (e.g., one bit of the data is associated with an error and is corrected) with relatively lower diagnostic coverage (e.g., a measure of the error control engine's ability to detect errors of different magnitudes). However, in other cases, an error control engine of a memory system may be configured to perform error detection operations (e.g., error detection code (EDC) operations), which may be associated with relatively higher diagnostic coverage yet may not support single-bit error correction. In some examples, some memory systems may configure the error control engine to perform error correction operations, whereas other memory systems may configure the error control engine to perform error detection operations (e.g., based on applications of users). However, in some such examples, an error control engine may not support performing both error correction operations and error detection operations, without the addition of error control circuitry such as logic gates, which may be associated with spatial, manufacturing, or cost inefficiency. Further, configuring each error control engine of each memory system to support desired error control operations may be associated with manufacturing challenges (e.g., associated with customizing each memory system).

In accordance with examples as described herein, a memory system may implement an error control engine configured to support both error correction operations and error detection operations. For example, the error control engine may be configured to switch between an error correction mode (e.g., an ECC mode) and an error detection mode (e.g., an EDC mode) based on a configuration of the memory system. In some such examples, the error control engine may be configured to perform error correction operations yet may include a syndrome check which enables the error control engine to also perform error detection operations. The error control engine may receive data and error control information associated with the data, generate additional error control information associated with the data, and compare the received and generated error control information to determine whether one or more errors are present in the data. In some examples, the memory system may configure the error control engine to operate in the error correction mode, and the error control engine may correct single-bit errors in the data (e.g., and detect and transmit an indication of double-bit errors). In other examples, the memory system may configure the error control engine to operate in the error detection mode, and the error control engine may detect errors in the data (e.g., and correct single-bit errors in the data) and transmit an indication of the errors. Thus, configuring the error control engine to support both single-bit error correction capability and a relatively high diagnostic coverage may enable the memory systems to selectively prioritize error correction or error detection for data of the memory system, while reducing the altering of components or circuitry of the error control engine.

Features of the disclosure are illustrated and described in the context of systems and dies. Features of the disclosure are further illustrated and described in the context of error control diagrams, results, process flows, and flowcharts.

FIG. 1 shows an example of a system 100 that supports selective mode error control in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system 100 that is operable to store data for one or more other components of the system 100.

Portions of the system 100 may be examples of the host device 105. The host device 105 may be an example of a processor (e.g., circuitry, processing circuitry, a processing component) within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, a system on a chip (SoC), or some other stationary or portable electronic device, among other examples. In some examples, the host device 105 may refer to the hardware, firmware, software, or any combination thereof that implements the functions of an external memory controller 120. In some examples, the external memory controller 120 may be referred to as a host (e.g., host device 105).

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other functions.

The memory device 110 may be operable to store data for the components of the host device 105. In some examples, the memory device 110 (e.g., operating as a secondary-type device to the host device 105, operating as a dependent-type device to the host device 105) may respond to and execute commands provided by the host device 105 through the external memory controller 120. Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of the host device 105 may be coupled with one another using a bus 135.

The processor 125 may be operable to provide functionality (e.g., control functionality) for the system 100 or the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or any combination of these components. In such examples, the processor 125 may be an example of a central processing unit (CPU), a graphics processing unit (GPU), a general purpose GPU (GPGPU), or an SoC, among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include instructions (e.g., a program, software) stored in one or more of read-only memory (ROM), flash memory, or other non-volatile memory.

The memory device 110 may include a memory device controller 155 and one or more memory dies 160 (e.g., memory chips) to support a capacity (e.g., a desired capacity, a specified capacity) for data storage. Each memory die 160 (e.g., memory die 160-a, memory die 160-b, memory die 160-N) may include a local memory controller 165 (e.g., local memory controller 165-a, local memory controller 165-b, local memory controller 165-N) and a memory array 170 (e.g., memory array 170-a, memory array 170-b, memory array 170-N). A memory array 170 may be a collection (e.g., one or more grids, one or more banks, one or more tiles, one or more sections) of memory cells, with each memory cell being operable to store one or more bits of data. A memory device 110 including two or more memory dies 160 may be referred to as a multi-die memory or a multi-die package or a multi-chip memory or a multi-chip package.

The memory device controller 155 may include components (e.g., circuitry, logic) operable to control operation of the memory device 110. The memory device controller 155 may include hardware, firmware, or instructions that enable the memory device 110 to perform various operations and may be operable to receive, transmit, or execute commands, data, or control information related to the components of the memory device 110. The memory device controller 155 may be operable to communicate with one or more of the external memory controller 120, the one or more memory dies 160, or the processor 125. In some examples, the memory device controller 155 may control operation of the memory device 110 described herein in conjunction with the local memory controller 165 of the memory die 160.

In some examples, the memory device 110 may communicate information (e.g., data, commands, or both) with the host device 105. For example, the memory device 110 may receive a write command indicating that the memory device 110 is to store data received from the host device 105, or receive a read command indicating that the memory device 110 is to provide data stored in a memory die 160 to the host device 105, among other types of information communication.

A local memory controller 165 (e.g., local to a memory die 160) may include components (e.g., circuitry, logic) operable to control operation of the memory die 160. In some examples, a local memory controller 165 may be operable to communicate (e.g., receive or transmit data or commands or both) with the memory device controller 155. In some examples, a memory device 110 may not include a memory device controller 155, and a local memory controller 165 or the external memory controller 120 may perform various functions described herein. As such, a local memory controller 165 may be operable to communicate with the memory device controller 155, with other local memory controllers 165, or directly with the external memory controller 120, or the processor 125, or any combination thereof. Examples of components that may be included in the memory device controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other components operable for supporting described operations of the memory device controller 155 or local memory controller 165 or both.

The external memory controller 120 may be operable to enable communication of information (e.g., data, commands, or both) between components of the system 100 (e.g., between components of the host device 105, such as the processor 125, and the memory device 110). The external memory controller 120 may process (e.g., convert, translate) communications exchanged between the components of the host device 105 and the memory device 110. In some examples, the external memory controller 120, or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a memory device controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be an example of a transmission medium that carries information between the host device 105 and the memory device 110. Each channel 115 may include one or more signal paths (e.g., a transmission medium, a conductor) between terminals associated with the components of the system 100. A signal path may be an example of a conductive path operable to carry a signal. For example, a channel 115 may be associated with a first terminal (e.g., including one or more pins, including one or more pads) at the host device 105 and a second terminal at the memory device 110. A terminal may be an example of a conductive input or output point of a device of the system 100, and a terminal may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or any combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

In some examples, CA channels 186 may be operable to communicate commands between the host device 105 and the memory device 110 including control information associated with the commands (e.g., address information). For example, commands carried by the CA channel 186 may include a read command with an address of the desired data. In some examples, a CA channel 186 may include any quantity of signal paths (e.g., eight or nine signal paths) to communicate control information (e.g., commands or addresses).

In some examples, data channels 190 may be operable to communicate information (e.g., data, control information) between the host device 105 and the memory device 110. For example, the data channels 190 may communicate information (e.g., bi-directional) to be written to the memory device 110 or information read from the memory device 110.

In some examples, the one or more other channels 192 may include one or more error detection code (EDC) channels. The EDC channels may be operable to communicate error detection signals, such as checksums, to improve system reliability. An EDC channel may include any quantity of signal paths.

In accordance with examples as described herein, the system 100 may implement an error control engine configured to support both error correction operations and error detection operations. For example, the error control engine may be configured to switch between an error correction mode (e.g., an ECC mode) and an error detection mode (e.g., an EDC mode) based on a configuration of the system 100 (e.g., selected by a user of the system 100). In some such examples, the error control engine may be configured to perform error correction operations yet may include a syndrome check which enables the error control engine to also perform error detection operations. The error control engine may receive data and error control information associated with the data, generate additional error control information associated with the data, and compare the received and generated error control information to determine whether one or more errors are present in the data. In some examples, the system 100 may configure the error control engine to operate in the error correction mode, and the error control engine may correct single-bit errors in the data (e.g., and detect and transmit an indication of double-bit errors). In other examples, the system 100 may configure the error control engine to operate in the error detection mode, and the error control engine may detect errors in the data (e.g., and correct single-bit errors in the data) and transmit an indication of the errors. Thus, configuring the error control engine to support both single-bit error correction capability and a relatively high diagnostic coverage may enable the system 100 to selectively prioritize error correction or error detection for data of the system 100, while reducing the altering of components or circuitry of the error control engine.

In addition to applicability in memory systems described herein, techniques for selective mode error control may be generally implemented to improve security and/or authentication features of various electronic devices and systems. As the use of electronic devices for handling private, user, or other sensitive information has become even more widespread, electronic devices and systems have become the target of increasingly frequent and sophisticated attacks. Further, unauthorized access or modification of data in security-critical devices such as vehicles, healthcare devices, and others may be especially concerning. Implementing the techniques described herein may improve the security of electronic devices and systems by enabling memory systems to select between high error correction capability and high error detection capability, which may enable users to manipulate the memory systems based on applications of the memory systems (e.g., to prioritize latency, throughput, or diagnostic coverage), among other benefits.

Figure 2:
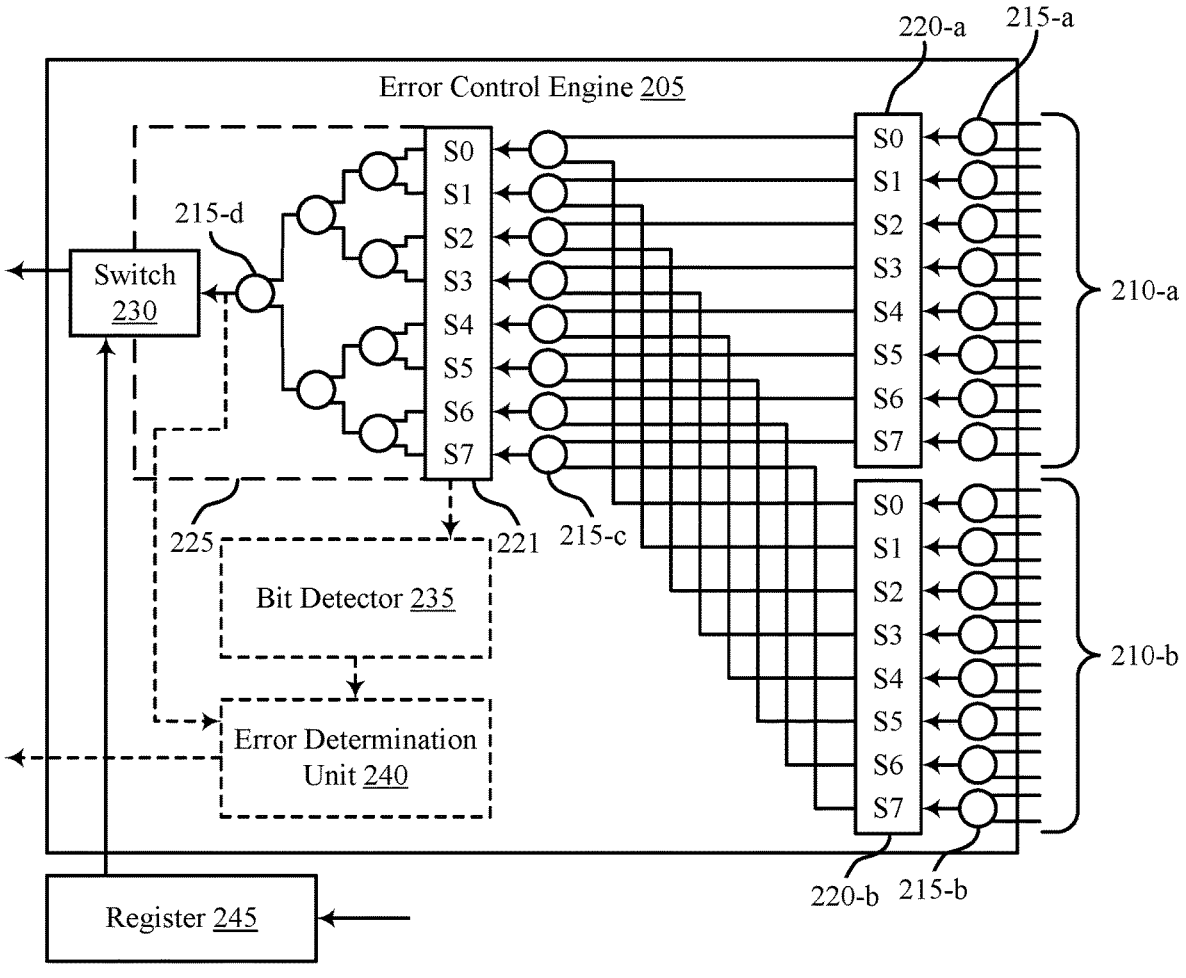
FIG. 2 shows an example of an error control circuit diagram that supports selective mode error control in accordance with examples as disclosed herein.

FIG. 2 shows an example of an error control circuit diagram 200 that supports selective mode error control in accordance with examples as disclosed herein. The error control circuit diagram 200 may implement aspects or operations of a system 100 as described with reference to FIG. 1. For example, the error control circuit diagram 200 may depict an error control engine 205 which may be implemented at a host device or a memory device, which may be an example of a host device 105 or a memory device 110, respectively, as described with reference to FIG. 1. The error control engine 205 may be configured to switch between an error correction mode and an error detection mode based on a configuration of the memory device.

In some cases, the error control engine 205 may be implemented in a memory device of a system including one or more memory devices coupled with a host device. In some such cases, the one or more memory device may be configured to communicate information with the host device over one or more channels, which may include one or more data channels (e.g., configured to transmit data) and a dedicated error control channel (e.g., configured to transmit error control information). For example, the host device may communicate data (e.g., user data) with the one or more memory devices via the one or more data channels, and communicate error control information (e.g., parity bits) with the one or more memory devices (e.g., the memory device implementing the error control engine 205) via the dedicated error control channel.

The error control engine 205 may be configured to perform error control operations that may include error correction operations and error detection operations. Performing an error correction operation may include receiving (e.g., via the error control engine 205 or a controller of the memory device) data and error control information associated with the data (e.g., as part of a write operation). In some examples, the data may be an example of a codeword including a quantity of data bits and a quantity of parity bits. In some examples, the error control engine 205 may generate the error control information based on receiving the data. After receiving the data and the error control information, the data and the error control information may be stored (e.g., via the error control engine 205 or the controller) at one or more memory arrays of the one or more memory devices. Later, the data and the error control information may be retrieved (e.g., via the error control engine 205 or the controller) from the one or more memory arrays (e.g., as part of a read operation). Then, the error control engine 205 may generate additional error control information associated with the data, and compare the received (e.g., or generated) error control information with the generated error control information. The error control engine 205 may determine whether one or more errors are present in the data based at least in part on comparing the error control information. If the error control engine 205 detects a single error in the data, the error control engine 205 may correct the error based on flipping a value of the bit associated with the error. If the error control engine 205 detects two errors in the data, the error control engine 205 may transmit an indication of the errors to the host device.

For example, when performing the error correction operation, the error control engine 205 may retrieve data and error control information 210-a associated with performing a write operation, and input the data and/or error control information 210-a into logic gates 215-a to generate a first code 220-a, which may include the data and/or the error control information 210-a. In some implementations, the first code 220-a may include a portion or all of the data and/or the error control information associated with performing the write operation. The error control engine 205 may generate error control information 210-b for the data based on performing a read operation of the data, and input the data and/or the error control information 210-b into logic gates 215-b to generate a second code 220-b which may include the data and/or the error control information 210-b. In some implementations, the second code 220-b may include a portion or all of the data and/or the error control information associated with performing the read operation. After generating the first code 220-a and the second code 220-b, the error control engine 205 may compare the first code 220-a with the second code 220-b based on inputting the first code 220-a and the second code 220-b into logic gates 215-c. The error control engine 205 may generate a syndrome 221 based on comparing the first code 220-a with the second code 220-b. In some cases, the error control engine 205 may determine one or more errors in the data based on identifying (e.g., detecting) one or more values (e.g., unexpected values) of the syndrome 221. In some such cases, the error control engine 205 may correct the data (e.g., flip a bit of the data) if a single-bit error is detected in the data. In some examples, if a double-bit error is detected in the data, the error control engine 205 may transmit an indication to the host device. In some cases, the first code 220-a and the second code 220-b may be examples of syndromes.

In some cases, the error control engine 205 may be configured to perform an error detection operation, which may include similar techniques as described above with additional techniques described below. For example, during performing the error detection operation, the error control engine 205 may compare the received and generated error control information to determine whether one or more errors are present in the data (e.g., as in the error correction operation). However, during performing the error detection operation, the error control engine 205 may additionally perform a syndrome check 225 (e.g., after correcting a single-bit error or detecting a double-bit error in the data). The syndrome check 225 may include inputting the syndrome 221 into a quantity of logic gates 215-d to determine whether one or more errors are present in the data. The syndrome check 225 may be configured to provide an output indicating whether one or more errors are present in the data, including whether any bits of the data were corrected (e.g., flipped) after generating the syndrome 221. For example, the syndrome check 225 may output a first value based on determining no errors in the data, whereas the syndrome check 225 may output a second value based on determining one or more errors in the data (e.g., or one or more corrected bits in the data). In some cases, the syndrome check 225 may be similarly performed for the error correction operation, however the syndrome check 225 may not output a result of the syndrome check (e.g., based on a configuration of a switch 230).

The error control engine 205 may be configured to switch between performing error correction operations and error detection operations. For example, the error control engine 205 may be configured to operate in an error correction mode for performing error correction operations and an error detection mode for performing error detection operations. In some cases, the memory device implementing the error control engine 205 may receive an indication of the desired mode for the error control engine 205 to operate in (e.g., from a host device). For example, the error control engine 205 may receive an indication to perform an error detection operation and the error control engine 205 may enter the error detection mode. Alternatively, the error control engine 205 may receive an indication to perform an error correction operation and the error control engine 205 may enter the error correction mode.

The error control engine 205 may include a switch 230 to operate the error control engine 205 in the error detection mode or the error correction mode based on a configuration of the switch 230. In some examples, the switch 230 may be coupled with a register 245 (e.g., a mode register) such that the switch 230 may be configured based on a field (e.g., one or more bits) of the register 245. The configuration of the switch 230 may determine whether a result of the syndrome check 225 is output to the host device. For example, the syndrome check 225 may be performed for both the error correction mode and the error detection mode, however, the result of the syndrome check 225 may be transmitted (e.g., or refrained from transmitted) to the host device based on the configuration of the switch 230. A first configuration of the switch 230 (e.g., associated with the error control engine 205 operating in the error detection mode) may indicate the error control engine 205 to transmit a result (e.g., the first value or the second value of the syndrome check) of the syndrome check 225, whereas a second configuration of the switch 230 (e.g., associated with the error control engine 205 operating in the error correction mode) may indicate the error control engine 205 to refrain from transmitting the result of the syndrome check 225. In other cases, the configuration of the switch 230 may indicate whether to perform the syndrome check 225, such that the syndrome check 225 may not be performed when the switch 230 has the second configuration (e.g., associated with the error correction mode). In such cases, the switch may be positioned to gate the input of the syndrome check 225 components.

In some cases, indicating the error control engine 205 to operate in the desired mode may include setting a field of the register 245 of the memory device to a logic value indicative of the respective mode (e.g., based on an indication from the host device). For example, setting the field to a first logic value may indicate the error control engine 205 to operate in the error detection mode, whereas setting the field to a second logic value may indicate the error control engine 205 to operate in the error correction mode. In some implementations, the error control engine 205 may check (e.g., monitor) the register (e.g., based on a command) prior to performing an error control operation to determine whether to perform the error control operation in the error detection mode or the error correction mode, and operate in the corresponding mode based on the logic value of the field. In other implementations, the switch 230 may be selectively coupled with the register based on a value of the field, such that the switch 230 may be coupled with the register when the first logic value is stored in the field.

In some cases, the error control engine 205 may include a bit detector 235 coupled with the syndrome check 225. The bit detector 235 may be configured to detect whether any bits of the syndrome 221 were corrected (e.g., flipped), and output an indication (e.g., of whether any bits of the syndrome 221 were corrected) to an error determination unit 240. In some cases, the error determination unit 240 may include a multi-bit detector configured to detect whether one or more detected errors are a single-bit error, or multi-bit errors. The error determination unit 240 may be coupled with the syndrome check 225 and may be configured to determine a quantity and type of errors in the data based on an output of the syndrome check 225 and the bit detector 235 (e.g., and the multi-bit detector). For example, if the syndrome check 225 indicates (e.g., flags) no errors, and the bit detector 235 indicates (e.g., flags) no corrections, the data did not include errors. If the syndrome check 225 indicates one or more errors, and the bit detector 235 indicates corrections (e.g., and the multi-bit detector unit indicates a single-bit error), the data included a single-bit corrected error. If the syndrome check 225 indicates one or more errors and the bit detector 235 indicates no corrections, the data included a multi-bit error. In some implementations, if the syndrome check 225 indicates no errors and the bit detector 235 indicates corrections, one or more logic gates 215 of the memory device may be corrupted.

In accordance with examples as disclosed herein, the error control engine 205 may be configured to switch between the error correction mode and the error detection mode, which may support performing both error correction and error detection at the error control engine 205. Implementing the syndrome check 225 to add error detection functionality to the error correction techniques may enable relatively higher diagnostic coverage and single-bit error correction without a substantial addition of error control circuitry.

Figure 3:
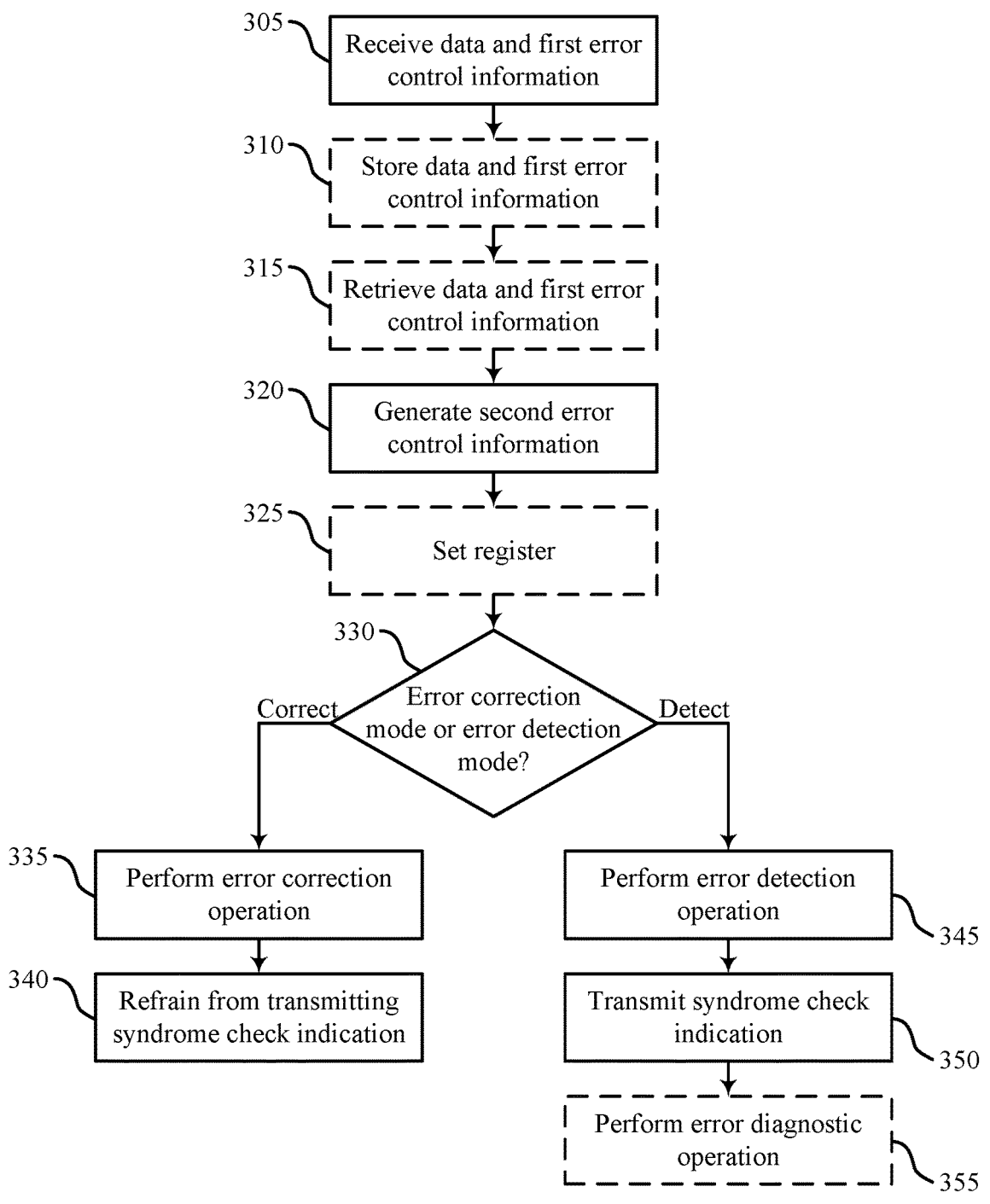
FIG. 3 shows an example of a process flow that supports selective mode error control in accordance with examples as disclosed herein.

FIG. 3 shows an example of a process flow 300 that supports selective mode error control in accordance with examples as disclosed herein. The process flow 300 may illustrate aspects or operations of a system 100 implementing an error control engine 205, as described with reference to FIGS. 1 and 2, respectively. In the following description of the process flow 300, the methods, techniques, processes, and operations may be performed in different orders or at different times. Further, certain operations may be left out of the process flow 300, or other operations may be added to the process flow 300. The process flow 300 may depict operations associated with performing an error control operation based on a selected error control mode. For example, the process flow 300 shows operation paths associated with operating the error control engine 205 in an error correction mode or an error detection mode.

At 305, the error control engine 205 may receive data (e.g., host device data) and first error control information (e.g., parity bits) associated with the data. In some examples, the error control engine 205 may receive the data and the first error control information from a host device coupled with a memory device implementing the error control engine 205. The data may be received over one or more data channels between the host device and the memory device, and the first error control information may be received over a dedicated error control channel between the host device and the memory device. In some such examples, the error control engine 205 may receive the data and the first error control information as part of performing a write operation at the memory device. In some implementations, the error control engine 205 may receive the data and generate the first error control information.

At 310, the data and the first error control information may be stored (e.g., via the error control engine 205 or a controller of the memory device) to the memory device. In some cases, the data and the first error control information may be stored to one or more memory arrays of the memory device (e.g., or one or more other memory arrays of one or more other memory devices coupled with the host device).

At 315, the data and the first error control information may be retrieved (e.g., via the error control engine 205 or a controller of the memory device) from the memory device. In some cases, the data and the first error control information may be retrieved from the one or more memory arrays of the memory device and transmitted to the error control engine 205.

At 320, the error control engine 205 may generate second error control information (e.g., parity bits) associated with the data. In some cases, the error control engine 205 may generate the second error control information as part of performing a read operation.

At 325, a field (e.g., one or more bits) of a register (e.g., a mode register) of the memory device may be set to a logic value indicating whether to operate the error control engine 205 in an error correction mode or an error detection mode. For example, setting the field to a first logic value may indicate the error control engine 205 to perform an error detection operation, whereas setting the field to a second logic value may indicate the error control engine 205 to perform an error detection operation. In some cases, the field may be set based on receiving an indication from a host device coupled with the memory device, where the indication may indicate the error control engine 205 to operate in the error correction mode or the error detection mode.

At 330, the error control engine 205 may determine whether to operate in the error correction mode or the error detection mode. In some cases, the error control engine 205 may determine which mode to operate in based on checking the register and identifying which logic value the field is set to. In some examples, the error control engine 205 may check the register and identify the field is set to the first logic value (e.g., associated with the error detection mode), and determine to operate in the error detection mode. In some such examples, the process flow 300 may proceed to step 345. In other examples, the error control engine 205 may check the register and identify the field is set to the second logic value (e.g., associated with the error correction mode), and determine to operate in the error correction mode. In some such examples, the process flow 300 may proceed to step 335. In some cases, the error control engine 205 may set a configuration of a switch coupled with a result of a syndrome check based on determining whether to operate in the error correction or the error detection mode. For example, based on determining to operate in the error detection mode, the error control engine 205 may set the configuration of the switch such that the result of the syndrome check may be transmitted to the host device.

At 335, the error control engine 205 may perform an error correction operation on the data. Performing the error correction operation on the data may include comparing the first error control information to the second error control information to determine whether one or more errors are present in the data. If a comparison of the first error control information and the second error control information indicates a single-bit error in the data, the error control engine 205 may correct the single-bit error based on flipping the bit (e.g., flipping a logic value stored at the bit) associated with the error. If the comparison indicates a double-bit error in the data, the error control engine 205 may transmit an indication of the double-bit error to the host device. In some cases, as part of performing the error correction operation, the error control engine 205 may perform a syndrome check (e.g., which may be an example of a syndrome check 225, as described with reference to FIG. 2) on the data to determine whether one or more errors are presented or corrected in the data.

At 340, the error control engine 205 may refrain from transmitting an indication of results of the syndrome check. The error control engine 205 may refrain from transmitting the indication of the results based on the error control engine 205 operating in the error correction mode.

At 345, the error control engine 205 may perform an error detection operation on the data. Performing the error detection operation on the data may include comparing the first error control information to the second error control information to determine whether one or more errors are present in the data. If a comparison of the first error control information and the second error control information indicates a single-bit error in the data, the error control engine 205 may correct the single-bit error based on flipping the bit (e.g., flipping a logic value stored at the bit) associated with the error. If the comparison indicates a double-bit error in the data, the error control engine 205 may transmit an indication of the double-bit error to the host device. Additionally, as part of performing the error detection operation, the error control engine 205 may perform a syndrome check (e.g., which may be an example of a syndrome check 225, as described with reference to FIG. 2) on the data to determine whether one or more errors are present or corrected in the data. For example, the syndrome check may determine whether multi-bit errors are present in the data and whether a single-bit error was corrected in the data.

In some examples, the error correction operation and the error detection operation may both include correcting single bit errors. Such a configuration may allow a single error control engine to perform both modes (e.g., error detection and error control) and thereby use fewer gates than if two different engines were included in the system. A difference between the error correction operation and the error detection operation may be the transmission of the results of the syndrome check. Communicating such results may enable the receiving devices (e.g., a host device) adjust how such errors are handled and thereby achieve different diagnostic coverages for the data.

At 350, the error control engine 205 may transmit an indication of results of the syndrome check. The error control engine 205 may transmit the indication of the results based on the error control engine 205 operating in the error detection mode. In some cases, the error control engine 205 may determine one or more errors are present or corrected in the data and the error control engine 205 may transmit an error flag. However, in other cases, the error control engine 205 may determine one or more errors are not present and the data was not corrected and the error control engine 205 may transmit a no-error flag.

At 355, the error control engine 205 may perform an error diagnostic operation. The error diagnostic operation may determine a quantity or type of errors in the data. For example, the error control engine 205 may determine whether no errors are present in the data, a single-bit error was corrected in the data, or a multi-bit error is present in the data. The error control engine 205 make such a determination based on comparing the result of the syndrome check with a result of a bit detector configured to determine whether one or more bits of the data were corrected. The error control engine 205 may transmit an indication of the determination.

In some cases, after performing step 340 or step 355, the error control engine 205 may transmit the data to the host device.

In accordance with examples as disclosed herein, the error control engine 205 may be configured to switch between the error correction mode and the error detection mode, which may support performing both error correction and error detection at the error control engine 205. Implementing the syndrome check to add error detection functionality to the error correction techniques may enable relatively higher diagnostic coverage and single-bit error correction without a substantial addition of error control circuitry.

Figure 4:
FIG. 4 shows an example of an error control results table that supports selective mode error control in accordance with examples as disclosed herein.

FIG. 4 shows an example of an error control results table 400 that supports selective mode error control in accordance with examples as disclosed herein. The error control results table 400 may illustrate results of implementing an error control engine 205 in a system 100, as described with reference to FIGS. 2 and 1, respectively. For example, the error control results table 400 may depict results of operating the error control engine 205 in an error correction mode and an error detection mode. Specifically, the error control results table 400 illustrates results of operating the error control engine 205 in accordance with various data correction and detection schemes for detecting and correcting errors of different magnitudes (e.g., single-bit, double-bit, multi-bit).

The error control results table 400 illustrates an ability of the error control engine 205 to correct a single-bit error, detect a double-bit error, and detect a multi-bit error in the error correction mode for various correction and detection schemes. Similarly, the error control results table 400 illustrates an ability of the error control engine 205 to detect a single-bit error, detect a double bit error, and detect a multi-bit error in the error detection mode for the various correction and detection schemes. For example, in the error correction mode, the error control engine 205 may correct 100% of single-bit errors in data, detect between 99% and 100% of double-bit errors in the data (e.g., due to variations caused from a parity check matrix used in the error control operation), and detect 99.6% of multi-bit errors in the data using a 256+16 single error correction scheme (SEC). Whereas, in the error detection mode, the error control engine 205 may detect 100% of single-bit errors in data, detect 100% of double-bit errors in the data, and detect (e.g., nearly) 100% (e.g., 99.998%) of multi-bit errors in the data using the 256+16 single error correction scheme (SEC). In some cases, values of the error control results table 400 may be due to gating of even phantom error codes, such as for 128+8 SEC double-bit error detection in the error correction mode. In some cases, additional gating of error codes may be involved to achieve values of the error control results table 400 for the multi-bit detection in the error correction mode. In some cases, to calculate values of the error control results table 400 for the multi-bit detection in the error correction mode, the error control engine 205 may use Equation 1. Whereas, in other cases, to calculate values of the error control results table 400 for the multi-bit detection in the error detection mode, the error control engine 205 may use Equation 2.

$$1 - \frac{(\text{data bits} + \text{error control information bits} + 1)}{\left(2^{\text{error control information bits}}\right)} \quad (1)$$

$$1 - 1/\left(2^{\text{error control information bits (including parity wrapper)}}\right) \quad (2)$$

The various correction and detection schemes include 64+8 (e.g., 64 bits of data and 8 parity bits corresponding to the data) single error correction double error correction (SECDED), 128+8 SEC (e.g., 128 bits of data and 8 parity bits corresponding to the data), 128+9 SECDED (e.g., 128 bits of data and 9 parity bits corresponding to the data, or 128 bits of data, 8 parity bits, and 1 parity wrapper), 256+16 SEC (e.g., 256 bits of data and 16 parity bits corresponding to the data), and 256+16 SECDED (e.g., (e.g., 256 bits of data and 16 parity bits corresponding to the data). In some cases, to perform a syndrome check for the various correction and detection schemes, additional logic gates may be added to the error control engine. For example, for 64+8 SECDED, 7 logic gates (e.g., OR gates) may be added. For 128+8 SEC, 7 logic gates may be added. For 128+9 SECDED, 8 logic gates may be added. For 256+16 SEC, 15 logic gates may be added. For 256+16 SECDED, 15 logic gates may be added.

In accordance with examples as disclosed herein, the error control engine 205 may be configured to switch between the error correction mode and the error detection mode, which may support performing both error correction and error detection at the error control engine 205. Implementing the syndrome check to add error detection functionality to the error correction techniques may enable relatively higher diagnostic coverage and single-bit error correction without a substantial addition of error control circuitry.

Figure 5:
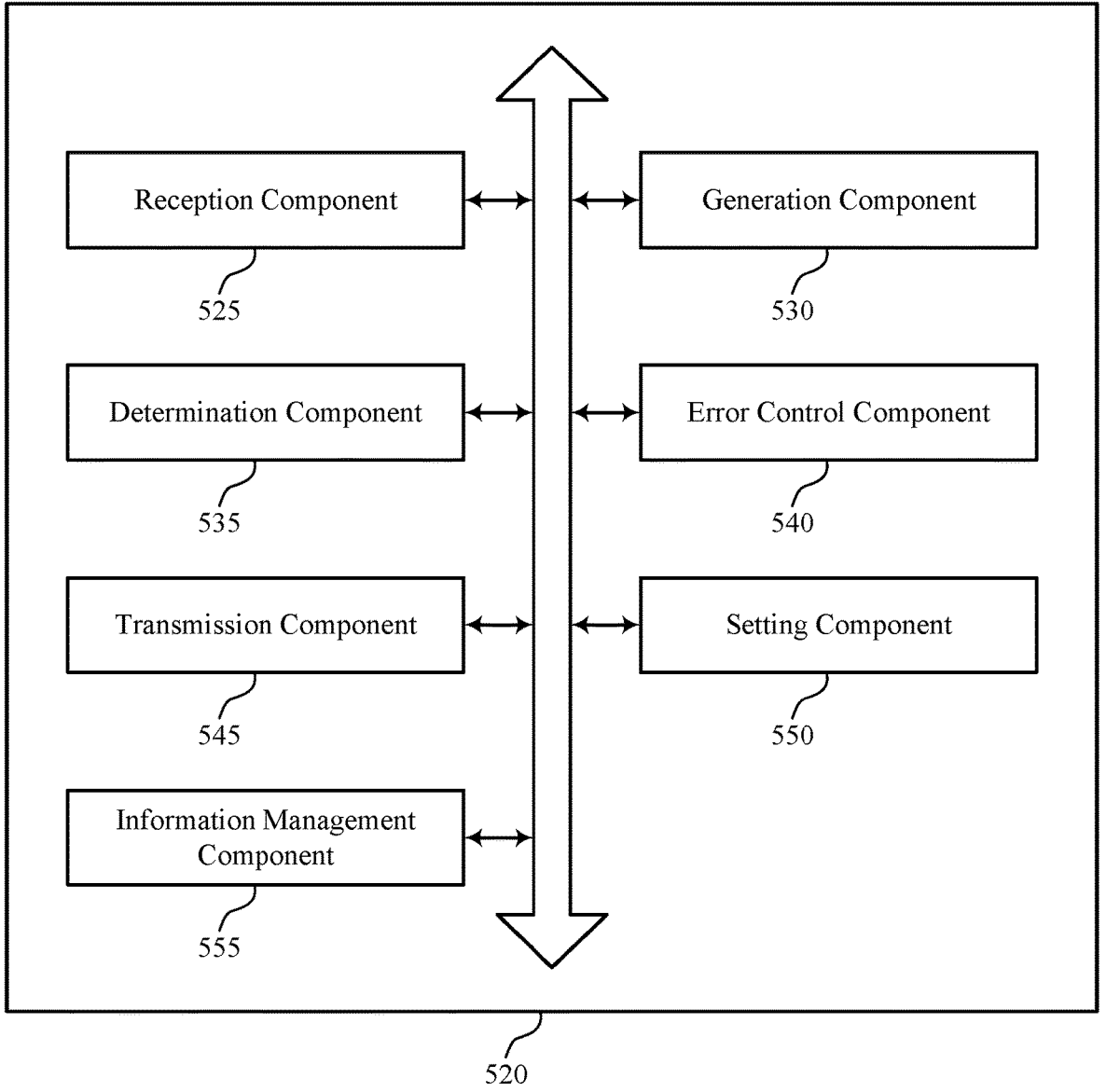
FIG. 5 shows a block diagram of a memory device that supports selective mode error control in accordance with examples as disclosed herein.

FIG. 5 shows a block diagram 500 of a memory device 520 that supports selective mode error control in accordance with examples as disclosed herein. The memory device 520 may be an example of aspects of a memory device as described with reference to FIGS. 1 through 4. The memory device 520, or various components thereof, may be an example of means for performing various aspects of selective mode error control as described herein. For example, the memory device 520 may include a reception component 525, a generation component 530, a determination component 535, an error control component 540, a transmission component 545, a setting component 550, an information management component 555, or any combination thereof. Each of these components may communicate, directly or indirectly, with one another (e.g., via one or more buses).

The reception component 525 may be configured as or otherwise support a means for receiving data and first error control information associated with the data. The generation component 530 may be configured as or otherwise support a means for generating second error control information associated with the data based at least in part on receiving the data and the first error control information. The determination component 535 may be configured as or otherwise support a means for determining whether to perform an error control operation for the data in an error correction mode or an error detection mode. The error control component 540 may be configured as or otherwise support a means for performing the error control operation based at least in part on comparing the first error control information and the second error control information. The transmission component 545 may be configured as or otherwise support a means for transmitting an indication of a syndrome check of the error control operation based at least in part on determining to operate in the error detection mode.

In some examples, the setting component 550 may be configured as or otherwise support a means for setting a field of a register to a first value indicating to operate in the error detection mode, where determining to operate in the error detection mode is based at least in part on checking the register and identifying the field is the first value, and where a second value indicates to operate in the error correction mode.

In some examples, the transmission component 545 may be configured as or otherwise support a means for transmitting the data to a host device based at least in part on performing the error control operation, where the indication relates to the data that is transmitted.

In some examples, the reception component 525 may be configured as or otherwise support a means for receiving second data and third error control information associated with the second data. In some examples, the generation component 530 may be configured as or otherwise support a means for generating fourth error control information associated with the second data based at least in part on receiving the second data and the third error control information. In some examples, the determination component 535 may be configured as or otherwise support a means for determining whether to operate a second error control operation for the second data in the error correction mode or the error detection mode. In some examples, the error control component 540 may be configured as or otherwise support a means for performing the second error control operation based at least in part on comparing the third error control information and the fourth error control information. In some examples, the transmission component 545 may be configured as or otherwise support a means for refraining from transmitting a second indication of a syndrome check of the second error control operation based at least in part on determining to operate in the error correction mode.

In some examples, the reception component 525 may be configured as or otherwise support a means for receiving an indication to operate in the error correction mode, where determining to operate in the error correction mode is based at least in part on receiving the indication.

In some examples, the setting component 550 may be configured as or otherwise support a means for setting a field of a register to indicate to operate in the error correction mode, where determining to operate in the error correction mode is based at least in part on checking the register and identifying the field is a value associated with the error correction mode.

In some examples, the reception component 525 may be configured as or otherwise support a means for receiving an indication to operate in the error correction mode, where determining to operate in the error correction mode is based at least in part on receiving the indication.

In some examples, to support performing the error control operation, the error control component 540 may be configured as or otherwise support a means for correcting a single-bit error in the data based at least in part on detecting the single-bit error in the data.

In some examples, the error control component 540 may be configured as or otherwise support a means for detecting a double-bit error in the data as part of performing the error control operation. In some examples, the transmission component 545 may be configured as or otherwise support a means for transmitting a second indication that the data includes a double-bit error.

In some examples, the determination component 535 may be configured as or otherwise support a means for determining whether a bit of the data was corrected based at least in part on performing the error control operation. In some examples, the transmission component 545 may be configured as or otherwise support a means for transmitting a second indication of whether a bit of the data was corrected.

In some examples, the data is received via one or more data channels and the first error control information is received over a dedicated channel.

In some examples, the information management component 555 may be configured as or otherwise support a means for storing the data and the first error control information in a memory array based at least in part on receiving the data and the first error control information. In some examples, the information management component 555 may be configured as or otherwise support a means for retrieving the data and the first error control information from the memory array, where generating the second error control information is based at least in part on retrieving the data from the memory array.

In some examples, the described functionality of the memory device 520, or various components thereof, may be supported by or may refer to at least a portion of a processor, where such a processor may include one or more processing elements (e.g., a controller, a microprocessor, a microcontroller, a digital signal processor, a state machine, discrete gate logic, discrete transistor logic, discrete hardware components, or any combination of one or more of such elements). In some examples, the described functionality of the memory device 520, or various components thereof, may be implemented at least in part by instructions (e.g., stored in memory, non-transitory computer-readable medium) executable by such a processor.

FIG. 6 shows a flowchart illustrating a method 600 that supports selective mode error control in accordance with examples as disclosed herein. The operations of method 600 may be implemented by a memory device or its components as described herein. For example, the operations of method 600 may be performed by a memory device as described with reference to FIGS. 1 through 5. In some examples, a memory device may execute a set of instructions to control the functional elements of the device to perform the described functions. Additionally, or alternatively, the memory device may perform aspects of the described functions using special-purpose hardware.

At 605, the method may include receiving data and first error control information associated with the data. In some examples, aspects of the operations of 605 may be performed by a reception component 525 as described with reference to FIG. 5.

At 610, the method may include generating second error control information associated with the data based at least in part on receiving the data and the first error control information. In some examples, aspects of the operations of 610 may be performed by a generation component 530 as described with reference to FIG. 5.

At 615, the method may include determining whether to perform an error control operation for the data in an error correction mode or an error detection mode. In some examples, aspects of the operations of 615 may be performed by a determination component 535 as described with reference to FIG. 5.

At 620, the method may include performing the error control operation based at least in part on comparing the first error control information and the second error control information. In some examples, aspects of the operations of 620 may be performed by an error control component 540 as described with reference to FIG. 5.

At 625, the method may include transmitting an indication of a syndrome check of the error control operation based at least in part on determining to operate in the error detection mode. In some examples, aspects of the operations of 625 may be performed by a transmission component 545 as described with reference to FIG. 5.

In some examples, an apparatus as described herein may perform a method or methods, such as the method 600. The apparatus may include features, circuitry, logic, means, or instructions (e.g., a non-transitory computer-readable medium storing instructions executable by a processor), or any combination thereof for performing the following aspects of the present disclosure:

Aspect 1: A method, apparatus, or non-transitory computer-readable medium including operations, features, circuitry, logic, means, or instructions, or any combination thereof for receiving data and first error control information associated with the data; generating second error control information associated with the data based at least in part on receiving the data and the first error control information; determining whether to perform an error control operation for the data in an error correction mode or an error detection mode; performing the error control operation based at least in part on comparing the first error control information and the second error control information; and transmitting an indication of a syndrome check of the error control operation based at least in part on determining to operate in the error detection mode.

Aspect 2: The method, apparatus, or non-transitory computer-readable medium of aspect 1, further including operations, features, circuitry, logic, means, or instructions, or any combination thereof for setting a field of a register to a first value indicating to operate in the error detection mode, where determining to operate in the error detection mode is based at least in part on checking the register and identifying the field is the first value, and where a second value indicates to operate in the error correction mode.

Aspect 3: The method, apparatus, or non-transitory computer-readable medium of any of aspects 1 through 2, further including operations, features, circuitry, logic, means, or instructions, or any combination thereof for transmitting the data to a host device based at least in part on performing the error control operation, where the indication relates to the data that is transmitted.

Aspect 4: The method, apparatus, or non-transitory computer-readable medium of any of aspects 1 through 3, further including operations, features, circuitry, logic, means, or instructions, or any combination thereof for receiving second data and third error control information associated with the second data; generating fourth error control information associated with the second data based at least in part on receiving the second data and the third error control information; determining whether to operate a second error control operation for the second data in the error correction mode or the error detection mode; performing the second error control operation based at least in part on comparing the third error control information and the fourth error control information; and refraining from transmitting a second indication of a syndrome check of the second error control operation based at least in part on determining to operate in the error correction mode.

Aspect 5: The method, apparatus, or non-transitory computer-readable medium of aspect 4, further including operations, features, circuitry, logic, means, or instructions, or any combination thereof for receiving an indication to operate in the error correction mode, where determining to operate in the error correction mode is based at least in part on receiving the indication.

Aspect 6: The method, apparatus, or non-transitory computer-readable medium of any of aspects 4 through 5, further including operations, features, circuitry, logic, means, or instructions, or any combination thereof for setting a field of a register to indicate to operate in the error correction mode, where determining to operate in the error correction mode is based at least in part on checking the register and identifying the field is a value associated with the error correction mode.

Aspect 7: The method, apparatus, or non-transitory computer-readable medium of any of aspects 1 through 6, further including operations, features, circuitry, logic, means, or instructions, or any combination thereof for receiving an indication to operate in the error correction mode, where determining to operate in the error correction mode is based at least in part on receiving the indication.

Aspect 8: The method, apparatus, or non-transitory computer-readable medium of any of aspects 1 through 7, where performing the error control operation includes operations, features, circuitry, logic, means, or instructions, or any combination thereof for correcting a single-bit error in the data based at least in part on detecting the single-bit error in the data.

Aspect 9: The method, apparatus, or non-transitory computer-readable medium of any of aspects 1 through 8, further including operations, features, circuitry, logic, means, or instructions, or any combination thereof for detecting a double-bit error in the data as part of performing the error control operation and transmitting a second indication that the data includes a double-bit error.

Aspect 10: The method, apparatus, or non-transitory computer-readable medium of any of aspects 1 through 9, further including operations, features, circuitry, logic, means, or instructions, or any combination thereof for determining whether a bit of the data was corrected based at least in part on performing the error control operation and transmitting a second indication of whether a bit of the data was corrected.

Aspect 11: The method, apparatus, or non-transitory computer-readable medium of any of aspects 1 through 10, where the data is received via one or more data channels and the first error control information is received over a dedicated channel.

Aspect 12: The method, apparatus, or non-transitory computer-readable medium of any of aspects 1 through 11, further including operations, features, circuitry, logic, means, or instructions, or any combination thereof for storing the data and the first error control information in a memory array based at least in part on receiving the data and the first error control information and retrieving the data and the first error control information from the memory array, where generating the second error control information is based at least in part on retrieving the data from the memory array.

It should be noted that the methods described herein describe possible implementations, and that the operations and the steps may be rearranged or otherwise modified and that other implementations are possible. Further, portions from two or more of the methods may be combined.

Information and signals described herein may be represented using any of a variety of different technologies and techniques. For example, data, instructions, commands, information, signals, bits, or symbols of signaling that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (e.g., in conductive contact with, connected with, coupled with) one another if there is any electrical path (e.g., conductive path) between the components that can, at any time, support the flow of signals (e.g., charge, current, voltage) between the components. At any given time, a conductive path between components that are in electronic communication with each other (e.g., in conductive contact with, connected with, coupled with) may be an open circuit or a closed circuit based on the operation of the device that includes the connected components. A conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" (e.g., "electrically coupling") may refer to condition of moving from an open-circuit relationship between components in which signals are not presently capable of being communicated between the components (e.g., over a conductive path) to a closed-circuit relationship between components in which signals are capable of being communicated between components (e.g., over the conductive path). When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorus, boron, or arsenic. Doping may be performed during the initial formation or growth of the substrate, by ion-implantation, or by any other doping means.

A switching component (e.g., a transistor) discussed herein may represent a field-effect transistor (FET), and may comprise a three-terminal component including a source (e.g., a source terminal), a drain (e.g., a drain terminal), and a gate (e.g., a gate terminal). The terminals may be connected to other electronic components through conductive materials (e.g., metals, alloys). The source and drain may be conductive, and may comprise a doped (e.g., heavily-doped, degenerate) semiconductor region. The source and drain may be separated by a doped (e.g., lightly-doped) semiconductor region or channel. If the channel is n-type (e.g., majority carriers are electrons), then the FET may be referred to as a n-type FET. If the channel is p-type (e.g., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to provide an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions (e.g., code) on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a processor, such as a DSP, an ASIC, an FPGA, discrete gate logic, discrete transistor logic, discrete hardware components, other programmable logic device, or any combination thereof designed to perform the functions described herein. A processor may be an example of a microprocessor, a controller, a microcontroller, a state machine, or any type of processor. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a computer, or a processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. An apparatus, comprising:
a memory device comprising one or more memory arrays; and
a controller coupled with the memory device and configured to cause the apparatus to:
receive data and first error control information associated with the data;
generate second error control information associated with the data based at least in part on receiving the data and the first error control information;
set a field of a register to a first value indicating to operate in an error detection mode, wherein determining to operate in the error detection mode is based at least in part on checking the register and identifying the field is the first value, and wherein a second value indicates to operate in an error correction mode;
determine whether to perform an error control operation for the data in an error correction mode or an error detection mode;
perform the error control operation based at least in part on comparing the first error control information and the second error control information; and
transmit an indication of a syndrome check of the error control operation based at least in part on determining to operate in the error detection mode.

2. The apparatus of claim 1, wherein the controller is further configured to cause the apparatus to:
transmit the data to a host device based at least in part on performing the error control operation, wherein the indication relates to the data that is transmitted.

3. The apparatus of claim 1, wherein the controller is further configured to cause the apparatus to:
receive second data and third error control information associated with the second data;
generate fourth error control information associated with the second data based at least in part on receiving the second data and the third error control information;
determine whether to operate a second error control operation for the second data in the error correction mode or the error detection mode;
perform the second error control operation based at least in part on comparing the third error control information and the fourth error control information; and
refrain from transmitting a second indication of a syndrome check of the second error control operation based at least in part on determining to operate in the error correction mode.

4. The apparatus of claim 3, wherein the controller is further configured to cause the apparatus to:
receive an indication to operate in the error correction mode, wherein determining to operate in the error correction mode is based at least in part on receiving the indication.

5. The apparatus of claim 3, wherein the controller is further configured to cause the apparatus to:
set a field of a register to indicate to operate in the error correction mode, wherein determining to operate in the error correction mode is based at least in part on checking the register and identifying the field is a value associated with the error correction mode.

6. The apparatus of claim 1, wherein the controller is further configured to cause the apparatus to:
receive an indication to operate in the error correction mode, wherein determining to operate in the error correction mode is based at least in part on receiving the indication.

7. The apparatus of claim 1, wherein performing the error control operation is configured to cause the apparatus to:
correct a single-bit error in the data based at least in part on detecting the single-bit error in the data.

8. The apparatus of claim 1, wherein the controller is further configured to cause the apparatus to:
detect a double-bit error in the data as part of performing the error control operation; and
transmit a second indication that the data includes the double-bit error.

9. The apparatus of claim 1, wherein the controller is further configured to cause the apparatus to:

determine whether a bit of the data was corrected based at least in part on performing the error control operation; and transmit a second indication of whether a bit of the data was corrected.

10. The apparatus of claim 1, wherein the data is received via one or more data channels and the first error control information is received over a dedicated channel.

11. The apparatus of claim 1, wherein the controller is further configured to cause the apparatus to:

store the data and the first error control information in the one or more memory arrays based at least in part on receiving the data and the first error control information; and retrieve the data and the first error control information from the one or more memory arrays, wherein generating the second error control information is based at least in part on retrieving the data from the one or more memory arrays.

12. A non-transitory computer-readable medium storing code, the code comprising instructions executable by a processor to:

receive data and first error control information associated with the data;

generate second error control information associated with the data based at least in part on receiving the data and the first error control information;

set a field of a register to a first value indicating to operate in an error detection mode, wherein determining to operate in the error detection mode is based at least in part on checking the register and identifying the field is the first value, and wherein a second value indicates to operate in an error correction mode;

determine whether to perform an error control operation for the data in an error correction mode or an error detection mode;

perform the error control operation based at least in part on comparing the first error control information and the second error control information; and transmit an indication of a syndrome check of the error control operation based at least in part on determining to operate in the error detection mode.

13. The non-transitory computer-readable medium of claim 12, wherein the instructions are further executable by the processor to:

receive second data and third error control information associated with the second data;

generate fourth error control information associated with the second data based at least in part on receiving the second data and the third error control information;

determine whether to operate a second error control operation for the second data in the error correction mode or the error detection mode;

perform the second error control operation based at least in part on comparing the third error control information and the fourth error control information; and refrain from transmitting a second indication of a syndrome check of the second error control operation based at least in part on determining to operate in the error correction mode.

14. The non-transitory computer-readable medium of claim 12, wherein the instructions are further executable by the processor to:

receive an indication to operate in the error correction mode, wherein determining to operate in the error correction mode is based at least in part on receiving the indication.

15. The non-transitory computer-readable medium of claim 12, wherein the instructions to perform the error control operation are executable by the processor to:

correct a single-bit error in the data based at least in part on detecting the single-bit error in the data.

16. The non-transitory computer-readable medium of claim 12, wherein the instructions are further executable by the processor to:

detect a double-bit error in the data as part of performing the error control operation; and transmit a second indication that the data includes the double-bit error.

17. The non-transitory computer-readable medium of claim 12, wherein the instructions are further executable by the processor to:

determine whether a bit of the data was corrected based at least in part on performing the error control operation; and transmit a second indication of whether a bit of the data was corrected.

18. A method, comprising:

receiving data and first error control information associated with the data;

generating second error control information associated with the data based at least in part on receiving the data and the first error control information;

set a field of a register to a first value indicating to operate in an error detection mode, wherein determining to operate in the error detection mode is based at least in part on checking the register and identifying the field is the first value, and wherein a second value indicates to operate in an error correction mode;

determining whether to perform an error control operation for the data in an error correction mode or an error detection mode;

performing the error control operation based at least in part on comparing the first error control information and the second error control information; and transmitting an indication of a syndrome check of the error control operation based at least in part on determining to operate in the error detection mode.

* * * * *